US006812714B2

United States Patent
Verspecht et al.

(10) Patent No.: US 6,812,714 B2
(45) Date of Patent: Nov. 2, 2004

(54) APPARATUS FOR COLLECTING SIGNAL MEASUREMENT DATA AT SIGNAL PORTS OF AN RF AND MICROWAVE DEVICE-UNDER-TEST, UNDER DIFFERENT IMPEDANCE LOAD CONDITIONS

(75) Inventors: Jan Verspecht, Steenhuffel (BE); Ewout Vandamme, Hingene (BE)

(73) Assignee: Agilent Technologies, Inc., Palo Alto, CA (US)

( * ) Notice: Subject to any disclaimer, the term of this patent is extended or adjusted under 35 U.S.C. 154(b) by 4 days.

(21) Appl. No.: 10/253,045

(22) Filed: Sep. 24, 2002

(65) Prior Publication Data

US 2003/0058058 A1 Mar. 27, 2003

(30) Foreign Application Priority Data

Sep. 25, 2001 (EP) .............................................. 01204290

(51) Int. Cl.[7] ............................ G01R 11/48; H03H 7/40
(52) U.S. Cl. ....................... 324/638; 324/642; 333/17.3; 333/109
(58) Field of Search ......................... 333/17.3, 32, 109; 324/638, 642; 702/117

(56) References Cited

U.S. PATENT DOCUMENTS 4,808,913 A  *  2/1989  Grace ..................... 333/109 X
5,629,653 A  *  5/1997  Stimson .................... 333/17.3

OTHER PUBLICATIONS

Lopez–Carrasco, A., Examiner. European Search Report, Application No. EP 01 20 4290, dated Mar. 14, 2002.
Di–Luan Le et al. "Network Analysis of Nonlinear Devices.." New York, May 10, 1994, pp. 998–1000, XP01012184.

Teeter, A. "Prediction of HBT ACPR.." Technical Digest, New York, Oct. 12, 1997, pp. 41–44, XP010251622.

Pattison L. et al. "Characterisation and Performance of High Power packaged Devices," Sep. 17, 1999, pp. 133–138, XP010361364.

Ghannouchi F M et al. "A New Harmonic Loading Method for Large– Signal Microwave.." vol. 39, No. 6, Jun. 1, 1991, pp. 986–992, XP000202828.

Blache F. et al. "A Novel Computerized Multiharmonic Active Load–Pull . . . " May 16, 1995, pp. 1037–1040, XP010141440.

Berghoff G et al. "Automated Characterization of HF Power Transistors . . . " IEEE Inc. vol. 46, No. 12, Dec. 1998, pp. 2068–2073, XP000793237.

* cited by examiner

*Primary Examiner*—Benny Lee

(57) ABSTRACT

An apparatus for collecting RF signal measurement data at signal ports of an RF and microwave device-under-test (DUT). The apparatus comprises means for measuring incident and reflected RF signals at the signal ports of the DUT. Synthesizer means for generating RF signals at a fundamental frequency and higher harmonics. Tuner means arranged for loading the DUT under different impedance conditions for the fundamental frequency and higher harmonics, and means for feeding the RF signals of the synthesizer means to the signal ports of the DUT. The apparatus may form part of a Non-linear Network Measurement System (NNMS).

11 Claims, 1 Drawing Sheet

US 6,812,714 B2

APPARATUS FOR COLLECTING SIGNAL MEASUREMENT DATA AT SIGNAL PORTS OF AN RF AND MICROWAVE DEVICE-UNDER-TEST, UNDER DIFFERENT IMPEDANCE LOAD CONDITIONS

FIELD OF THE INVENTION

The present invention relates generally to Radio Frequency (RF) and microwave technology, and more specifically to the measurement and processing of signal data of a device-under-test under different impedance load conditions.

BACKGROUND OF THE INVENTION

Telecommunication appliances like portable phones have been widely adopted by the general public. Just like Local-Multipoint Distribution Service, Wireless LAN, and Wideband CDMA, for example, these appliances rely heavily on microwave technology and contain such microwave components like mixers, low-noise amplifiers, power amplifiers, etc.

It turns out in practice that the design of power amplifiers often is one of the toughest problems to solve. Typically this requires several design iterations, the main reason being the limited accuracy of the RF transistor models used, especially with respect to the description of the non-linear behavior thereof.

Currently, transistor models for power amplifier design are based on DC, CV and/or S-parameter measurements. They can be either technology-dependent analytical models, such as Curtice Cubic, Materka, Statz, Tajima, BSIM, MM9, VBIC, and others, or measurement based such as HP-Root.

However, these models all are based on small signal measurements, whereas they are used in non-linear (large-signal) operation. Hence, one can expect that these models not always perform well in describing the hard non-linear behavior of a device-under-test like, for example, an RF power transistor. For these type of applications it is suggested to use so-called "non-linear scattering functions," or more generally the describing function, which can be considered an extension of the S-parameters formalism into hard non-linear behavior. Like S-parameters for the linear behavior, the describing function is a characteristic of the device and is independent on the (type of) measurement system that was used to measure it.

SUMMARY OF THE INVENTION

It is an object of the present invention to provide a novel apparatus for collecting RF signal measurement data at signal ports of an RF and microwave device-under-test, generally for characterizing the non-linear behavior of the device in a mismatched load environment, and in particular for performing measurements for extracting the non-linear scattering functions of a device-under-test.

It is a further object to provide a Non-linear Network Measurement System (NNMS) arranged for non-linear signal data acquisition of a device-under-test in accordance with the present invention.

According to the present invention, in a first aspect thereof, there is provided an apparatus for collecting RF signal measurement data at signal ports of an RF and microwave device-under-test, the apparatus comprising means for measuring incident and reflected RF signals at the signal ports, synthesizer means for generating RF signals at a fundamental frequency and higher harmonics of the fundamental frequency, tuner means arranged for loading the device-under-test under different impedance conditions for the fundamental frequency and the higher harmonics, and means for feeding the RF signals of the synthesizer means to the signal ports of the device-under-test.

The apparatus according to the invention provides for a novel data collection at the signal ports of a device-under-test providing a tunable impedance match for both the fundamental frequency and higher harmonics RF signals. Thereby combining passive and active harmonic loadpull measurements into one apparatus for extracting non-linear scattering functions of a device-under-test.

In an embodiment of the invention the apparatus comprises first synthesizer means, for generating the RF signals at the fundamental frequency, and second synthesizer means, for generating the higher harmonics RF signals, wherein the first and second synthesizer means connect to the signal ports of the device-under-test by diplexer means.

By connecting, in accordance with a further embodiment of the apparatus according to the invention, the second synthesizer means to the diplexer means by switching means, and by arranging the switching means for connecting the second synthesizer means to selected ones or all of the signal ports of the device-under-test, the higher harmonics can be selectively injected at one or a plurality of the signal ports of the device. This provides a maximum of measurement flexibility.

For varying the impedance match conditions of the synthesizers at the signal ports of the device, in a further embodiment of the invention, the first synthesizer means connect to the diplexer means by the tuner means.

In a still further embodiment of the invention, the second synthesizer means connect to the diplexer means in an impedance matched manner, such that the higher harmonics are injected under matched conditions. This contributes to the accuracy of the measurements, because in practice higher harmonics up to five times the fundamental frequency may be applied.

In order to even further enhance the accuracy of the measurement, in another embodiment of the invention, the first synthesizer means connect to the tuner means by means for terminating the higher harmonics.

Preferably, means for biasing the device-under-test connect by the tuner and diplexer means to the signal ports of the device-under-test.

For collecting and processing the measurement data a commercially available Non-linear Network Measurement System (NNMS), such as provided by Agilent Technologies, is used for data collecting, i.e. data acquisition and processing for extracting the non-linear scattering functions for characterizing the non-linear RF signal behavior of the device-under-test.

The invention further relates to an arrangement comprising synthesizer means for generating RF signals at a fundamental frequency and higher harmonics of the fundamental frequency, tuner means arranged for loading the device-under-test under different impedance conditions for the fundamental frequency and the higher harmonics, and means for feeding the RF signals of the synthesizer means to the signal ports of the device-under-test.

The invention also provides a modified Non-linear Network Measurement System (NNMS) enhanced by the arrangement disclosed above, for providing a single integrated apparatus for performing the measurements according to the present invention, as much as possible in an automated manner.

The above-mentioned and other features and advantages of the invention are illustrated in the following detailed description with reference to the enclosed drawings.

BRIEF DESCRIPTION OF THE DRAWING

A method and apparatus in accordance with this invention, for collecting RF signal measurement data at signal ports of an RF and microwave device-under-test, will now be described, by way of example, with reference to the accompanying drawings, in which.

DETAILED DESCRIPTION OF THE EMBODIMENT

Figure 1:
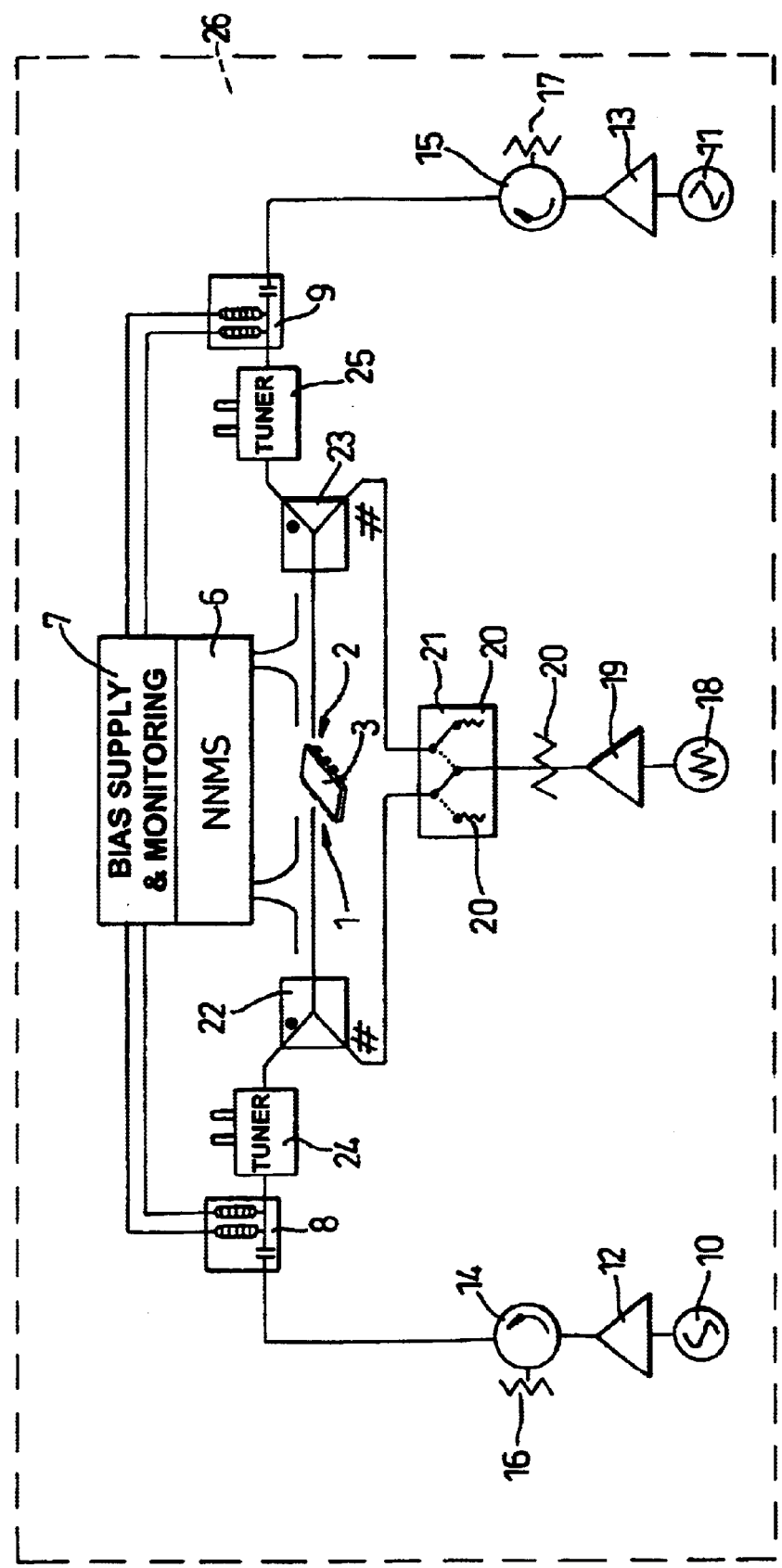
FIG. 1 shows, in a schematic and illustrative manner, an embodiment of apparatus for performing the method according to the invention.

FIG. 1 shows a general embodiment of the apparatus according to the invention, for collecting signal data of a Device-Under-Test (DUT) 3, having a first and a second signal port 1, 2, respectively.

The DUT 3 connects at each of the signal ports 1, 2 by couplers 4, 5 to a data measurement device 6, such as a Network Analyzer (NA). For the purpose of the present invention, a Non-linear Network Measurement System (NNMS) commercially available from Agilent Technologies is advantageously used.

The data measurement device 6 further comprises bias supply and monitoring means 7 for supplying bias voltages and currents for DC biasing of the DUT 3. The biasing signals are provided at the signal ports 1, 2 of the DUT through bias tees 8, 9, respectively. Each such bias tee 8, 9 comprises a capacitor and inductances, e.g. coils, for supplying the bias voltages and bias currents.

At an input of each bias tee 8, 9 terminating at the capacitor, first synthesizer means 10, 11 connect. These first synthesizer means 10, 11 are arranged for providing an RF signal at a fundamental frequency of the DUT 3.

Series connected with the first synthesizer means 10, 11 are amplifier means 12, 13 and wave terminating means 14, 15, such as circulators having a terminating load 16, 17 connected thereto.

Second synthesizer means 18 connect to switching means 21 by amplifier means 19, loaded with loads 20. The second synthesizer means 18 are arranged for generating higher harmonic frequencies of the fundamental frequency, up to five times or more. The loads 20 are matched loads for properly terminating the diplexers 22, 23.

The switching means 21 connect to a first port of diplexer means 22, 23, respectively. A second port of the diplexer means 22, 23 connects in each case by a tuner 24, 25 to an output of the respective bias tees 8, 9. Through the switching means 21, and the corresponding diplexer means 22, 23 the higher harmonics can be applied at either one or both of the signal ports 1, 2 of the DUT 3. This provides a very flexible measurement setup.

The diplexers 22, 23 are arranged such that the fundamental power is directed to the port thereof marked by a "•", while the power of all higher harmonics is directed to the other port, marked by a "#". In use, the tuners 24 and 25 can be tuned such that for both the fundamental frequency and the higher harmonics, the DUT 3 operates under different load conditions, for obtaining measurement data for extracting parameters for describing the non-linear behavior of the DUT 3.

It is noted that the DUT 3 does not necessarily has to be limited to devices having just two signal ports, such as an input port and an output port. The apparatus according to the present invention may be designed for use with DUTs having a plurality of signal ports.

The apparatus according to the invention may be provided as a separate arrangement for use with a network analyzer, such as the NNMS, or can be integrated with such an NNMS as schematically indicated by dashed lines 26, with the exception of the DUT 3. Processing of the measurement data for extracting the describing function is preferably performed by the NNMS 26, including suitable processing means.

The invention is not limited to the arrangement shown. Those skilled in the art will appreciate that a number of modifications can be made for measuring a device-under-test under different load conditions, without departing from the novel and inventive teachings of the present invention.

What is claimed is:

1. An apparatus for collecting RF signal measurement data at signal ports of an RF and microwave device-under-test, said apparatus comprising:

means for measuring incident and reflected RF signals at first and second signal ports of said device-under-test;

first synthesizer means for generating RF signals at a fundamental frequency;

second synthesizer means for generating RF signals at a selectable higher harmonics of said fundamental frequency; and tuner means arranged for loading said device-under-test under different impedance conditions for said fundamental frequency wherein said RF signals of said first synthesizer means are fed to said first and second signal ports via said tuner means, and said RF signals of said second synthesizer means are fed to at least one of said first and second signal ports.

2. An apparatus according to claim 1, wherein said first synthesizer means connects to said first and second signal ports of said device-under-test by diplexer means, and said second synthesizer means connects to at least one of said first and second signal ports of said device-under test by said diplexer means.

3. An apparatus according to claim 2, wherein said second synthesizer means connect to said diplexer means by switching means, said switching means being arranged for connecting said second synthesizer means to selected ones or all of said signal ports of said device-under-test.

4. An apparatus according to claim 3, wherein said second synthesizer means connect to said diplexer means in an impedance matched manner.

5. An apparatus according to claim 2, comprising biasing means for biasing said device-under-test, said biasing means being connected by said tuner means and diplexer means to said signal ports of said device-under-test.

6. An apparatus according to claim 1, wherein said first synthesizer means connect to said tuner means by wave terminating means.

7. An apparatus according to claim 1, wherein said first synthesizer means comprises (a) a synthesizer for generating an RE signal for said first signal port and (b) a synthesizer for generating an RE signal for said second signal port.

8. An apparatus according to claim 1, wherein said means for measuring incident and reflected RF signals comprise a Non-linear Network Measurement System (NNMS).

9. An arrangement for use with means for collecting RF signal measurement data of an RF and microwave device-under-test, said arrangement comprising:

first synthesizer means for generating RF signals at a fundamental frequency;

second synthesizer means for generating RF signals at a selectable higher harmonic of said fundamental frequency; and tuner means arranged for loading said device-under-test under different impedance conditions for said fundamental frequency, wherein said RF signals of said first synthesizer means are fed to first and second signal ports of said device-under-test via said tuner means, and said RF signals of said second synthesizer means are fed to at least one of said first and second signal ports.

10. Non-linear Network Measurement System (NNMS) arranged for collecting and processing incident and reflected measurement data of a device-under-test, for characterizing non-linear RE signal behavior of a device-under-test, said NNMS further comprising an arrangement according to claim 9.

11. An arrangement according to claim 9, wherein said first synthesizer means comprises (a) a synthesizer for generating an RE signal for said first signal port and (b) a synthesizer for generating an RE signal for said second signal port.

* * * * *